(12) United States Patent
Cho et al.

(10) Patent No.: US 9,406,608 B2
(45) Date of Patent: Aug. 2, 2016

(54) DUMMY METAL STRUCTURE AND METHOD OF FORMING DUMMY METAL STRUCTURE

(71) Applicant: GLOBALFOUNDRIES Inc., Grand Cayman (KY)

(72) Inventors: Jae Kyu Cho, Niskayuna, NY (US); Shan Gao, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 49 days.

(21) Appl. No.: 14/515,836

(22) Filed: Oct. 16, 2014

(65) Prior Publication Data

US 2016/0111360 A1   Apr. 21, 2016

(51) Int. Cl.
*H01L 21/768*   (2006.01)
*H01L 23/528*   (2006.01)
*H01L 23/522*   (2006.01)

(52) U.S. Cl.
CPC ........ *H01L 23/528* (2013.01); *H01L 21/76877* (2013.01); *H01L 21/76895* (2013.01); *H01L 23/5226* (2013.01)

(58) Field of Classification Search
CPC .................................................... H01L 23/528
See application file for complete search history.

(56) References Cited

U.S. PATENT DOCUMENTS

| 8,278,737 | B2 | 10/2012 | Chen et al. | |
| 2006/0022195 | A1* | 2/2006 | Wang | H01L 22/32 257/48 |
| 2007/0090447 | A1* | 4/2007 | Morimoto | H01L 21/768 257/316 |
| 2007/0158788 | A1* | 7/2007 | Yang | H01L 23/3192 257/620 |
| 2009/0115025 | A1* | 5/2009 | Jung | H01L 21/78 257/620 |
| 2010/0123219 | A1* | 5/2010 | Chen | B23K 26/367 257/620 |
| 2010/0207251 | A1* | 8/2010 | Yu | H01L 21/78 257/620 |
| 2010/0270686 | A1* | 10/2010 | Nakao | H01L 21/7684 257/774 |

* cited by examiner

*Primary Examiner* — Lex Malsawma
(74) *Attorney, Agent, or Firm* — Ditthavong & Steiner, P.C.

(57) ABSTRACT

Methods for forming a dummy metal structure between dies on a semiconductor wafer and the resulting devices are disclosed. Embodiments may include forming metal interconnection layers extending from a substrate of a semiconductor wafer to a top metal interconnection layer of the semiconductor wafer between a plurality of die regions, each of the metal interconnection layers including a plurality of dummy vertical interconnect accesses (VIAs) and a plurality of dummy metal lines, with the plurality of dummy metal lines laterally connecting the plurality of dummy VIAs within each respective metal interconnection layer, and a plurality of dummy VIAs within a first metal interconnection layer vertically connecting a plurality of dummy metal lines within the first metal interconnection layer to a plurality of dummy metal lines within a second metal interconnection layer, and the second metal interconnection layer being below the first metal interconnection layer.

9 Claims, 10 Drawing Sheets

DUMMY METAL STRUCTURE AND METHOD OF FORMING DUMMY METAL STRUCTURE

TECHNICAL FIELD

The present disclosure relates to spacing between dies in a semiconductor wafer. The present disclosure is particularly applicable to separating dies in a semiconductor wafer, particularly for semiconductor processing using ultra-low dielectric constant (ULK) technology.

BACKGROUND

Manufacturing semiconductor devices includes forming multiple devices or dies on a single semiconductor wafer. Die cutting, dicing, or singulation of the semiconductor wafer separates the multiple dies into discrete portions of the semiconductor wafer, with each portion of the wafer containing one of the dies.

Between the multiple dies on the semiconductor wafer are spaces for cutting the semiconductor wafer, such as by a saw, without damaging the dies. The spacing is also referred to as a scribe line. To maximize the area of the semiconductor wafer used in forming the devices, the width of the scribe line is formed as small as possible. However, the dimensions and the structure of the scribe line can cause delamination and/or cracking of the semiconductor wafer during a dicing process, particularly for brittle ULK technologies. It is known that discrete dummy structures that are connected vertically through vertical interconnect accesses (VIAs) and that are located in the scribe lines can minimize damage during dicing processes. However, such laterally discrete dummy structures in each layer can also be a crack propagation path.

A need, therefore, exists for methodology enabling formation of a scribe line between dies within a semiconductor wafer that does not suffer from delamination, cracking, and/or other issues during separation of the dies and the resulting device.

SUMMARY

An aspect of the present disclosure is methodology for forming a dummy metal structure between dies on a semiconductor wafer.

Another aspect of the present disclosure is a dummy metal structure between dies on a semiconductor wafer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first metal interconnection layer above a substrate of a semiconductor wafer and between a plurality of die regions, the first metal interconnection layer including a first plurality of dummy VIAs and a first plurality of dummy metal lines, the first plurality of dummy metal lines laterally connecting the first plurality of dummy VIAs; forming a second metal interconnection layer above the first metal interconnection layer and between the plurality of die regions, the second metal interconnection layer including a second plurality of dummy VIAs and a second plurality of dummy metal lines, the second plurality of dummy VIAs vertically connecting the first plurality of dummy metal lines with the second plurality of dummy metal lines, and the second plurality of dummy metal lines laterally connecting the second plurality of dummy VIAs; and forming one or more of the first metal interconnection layer and the second metal interconnection layer, in alternating order, in forming remaining metal interconnection layers of the semiconductor wafer.

An aspect of the present disclosure includes forming the first plurality of dummy metal lines across substantially all of an area between the plurality of die regions, and forming the second plurality of dummy metal lines across substantially all of the area between the plurality of die regions. A further aspect includes each of the first plurality of dummy metal lines and the second plurality of dummy metal lines including a first set of the dummy metal lines that extend in a first direction and a second set of the dummy metal lines that extend in a second direction. An additional aspect includes the second direction being orthogonal to the first direction. Yet another aspect includes the first set and the second set within each of the first plurality of dummy metal lines and the second plurality of dummy metal lines connecting at intersections to form junction areas. A further aspect includes widths and lengths of the junction areas being larger than widths of the first plurality of dummy metal lines and the second plurality of dummy metal lines. Aspects further include forming foundation metal interconnection pads within the substrate and/or on a top surface of the substrate, and forming the first plurality of dummy VIAs connected to the foundation metal interconnection pads. Yet another aspect includes forming the first metal interconnection layer and the second metal interconnection layer separated from the plurality of die regions by a gap. An additional aspect includes a pattern formed by the first plurality of dummy metal lines being different from a pattern formed by the second plurality of dummy metal lines.

Another aspect of the present disclosure is a device including: a substrate; a first metal interconnection layer above the substrate and between a plurality of die regions, the first metal interconnection layer including a first plurality of dummy VIAs and a first plurality of dummy metal lines, the first plurality of dummy metal lines laterally connecting the first plurality of dummy VIAs; a second metal interconnection layer above the first metal interconnection layer and between the plurality of die regions, the second metal interconnection layer including a second plurality of dummy VIAs and a second plurality of dummy metal lines, the second plurality of dummy VIAs vertically connecting the first plurality of dummy metal lines with the second plurality of dummy metal lines, and the second plurality of dummy metal lines laterally connecting the second plurality of dummy VIAs; and one or more additional metal interconnection layers corresponding to the first metal interconnection layer and the second metal interconnection layer, in alternating order, constituting remaining metal interconnection layers of the device.

Aspects include the first plurality of dummy metal lines extending across substantially all of an area between the plurality of die regions, and the second plurality of dummy metal lines extending across substantially all of the area between the plurality of die regions. A further aspect includes each of the first plurality of dummy metal lines and the second plurality of dummy metal lines including a first set of the dummy metal lines that extend in a first direction and a second set of the dummy metal lines that extend in a second direction. Another aspect includes the second direction being orthogonal to the first direction. Yet an additional aspect includes the first set and the second set within each of the first plurality of dummy metal lines and the second plurality of dummy metal lines connecting at intersections to form junction areas. A further aspect includes widths and lengths of the junction areas being larger than widths of the first plurality of dummy metal lines and the second plurality of dummy metal lines. Still additional aspects include foundation metal interconnection pads within the substrate and/or on a top surface of the substrate, with the first plurality of dummy VIAs connecting to the foundation metal interconnection pads. A further aspect including a gap between the dummy metal structure and the plurality of die regions. Another aspect includes a pattern formed by the first plurality of dummy metal lines being different from a pattern formed by the second plurality of dummy metal lines.

Additional technical effects may be achieved in part by a method including forming metal interconnection layers extending from a substrate of a semiconductor wafer to a top metal interconnection layer of the semiconductor wafer between a plurality of die regions, each of the metal interconnection layers including a plurality of dummy VIAs and a plurality of dummy metal lines, the plurality of dummy metal lines laterally connecting the plurality of dummy VIAs within each respective metal interconnection layer, and a plurality of dummy VIAs within a first metal interconnection layer vertically connecting a plurality of dummy metal lines within the first metal interconnection layer to a plurality of dummy metal lines within a second metal interconnection layer, with the second metal interconnection layer being below the first metal interconnection layer.

Further technical aspects include: forming foundation metal interconnection pads within the substrate; and forming the plurality of dummy VIAs of a metal interconnection layer immediately above the substrate connected to the foundation metal interconnection pads, with the plurality of dummy metal lines of each metal interconnection layer extending across substantially all of an area between the plurality of die regions, and the plurality of dummy metal lines of each metal interconnection layer including a first set of the dummy metal lines that extend in a first direction and a second set of the dummy metal lines that extend in a second direction Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which:

FIGS. 1 through 7 schematically illustrate a method for forming a dummy metal structure between dies in a semiconductor wafer, in accordance with an exemplary embodiment;

DETAILED DESCRIPTION

Figure 2:
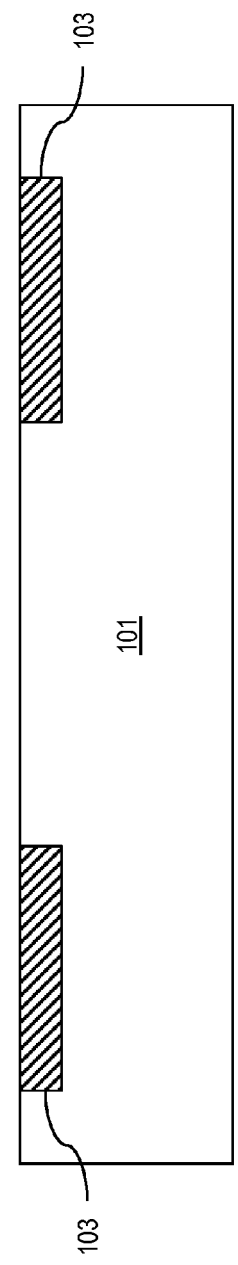

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of delamination, cracking, and/or other issues attendant upon separating dies of a semiconductor wafer. In accordance with embodiments of the present disclosure, a dummy metal structure is formed between the dies of a semiconductor wafer that does not suffer from the above issues.

Methodology in accordance with an embodiment of the present disclosure includes forming a first metal interconnection layer above a substrate of a semiconductor wafer and between a plurality of die regions. The first metal interconnection layer includes a first plurality of dummy VIAs and a first plurality of dummy metal lines, the first plurality of dummy metal lines laterally connecting the first plurality of dummy VIAs. The methodology further includes forming a second metal interconnection layer above the first metal interconnection layer and between the plurality of die regions. The second metal interconnection layer includes a second plurality of dummy VIAs and a second plurality of dummy metal lines, with the second plurality of dummy VIAs vertically connecting the first plurality of dummy metal lines with the second plurality of dummy metal lines, and the second plurality of dummy metal lines laterally connecting the second plurality of dummy VIAs. The methodology proceeds with forming one or more of the first metal interconnection layer and the second metal interconnection layer, in alternating order, in forming remaining metal interconnection layers of the semiconductor wafer. The first and second metal interconnection layers forming a dummy metal structure between the dies within the semiconductor wafer that withstands delamination, cracking, and other issues associated with separating the semiconductor wafer into the discrete dies.

Figure 1:
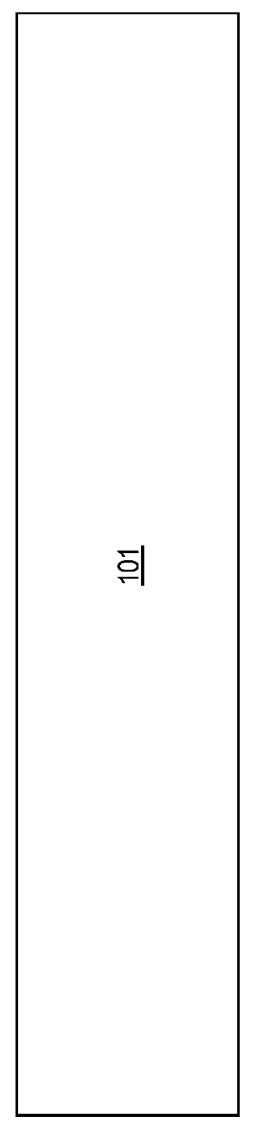

Adverting to FIG. 1, a method for forming a dummy metal structure between dies within a semiconductor wafer, according to an exemplary embodiment, begins with a substrate 101. The substrate 101 can be any type of substrate used in manufacturing semiconductor devices that have one or more metal interconnection layers formed above the substrate. It is understood by one having ordinary skill in the art that the substrate 101 illustrated in FIG. 1 is only a portion of a substrate of an entire semiconductor wafer. Specifically, the substrate 101 corresponds to a portion of the substrate of a semiconductor wafer between dies formed within and/or on the semiconductor wafer.

The substrate 101 may include foundation metal interconnection pads 103, as illustrated in FIG. 2. The foundation metal interconnection pads 103 may be within the substrate 101, such that the top surfaces of the foundation metal interconnection pads 103 are co-planar with the top surface of the substrate 101. Although not shown (for illustrative convenience), the top surfaces of the foundation metal interconnection pads 103 may alternatively be above the top surface of the substrate 101. Further, the foundation metal interconnection pads 103 may alternatively be formed on the top surface of the substrate 101 such that the bottom surface of the foundation metal interconnection pads 103 are on the top surface of the substrate 101.

The foundation metal interconnection pads 103 may be formed of a metal, such as copper (Cu) or aluminum (Al). The metal of the foundation metal interconnection pads 103 may be the same metal used in forming the metal routing layers, such as the M1, M2, . . . Mn layers, within the dies on the semiconductor wafer. Further, the foundation metal interconnection pads 103 may be formed according to the same processes used in forming the metal routing layers. The foundation metal interconnection pads 103 are formed in substantially all of the area of the semiconductor wafer between dies, except for exclusion areas between dies, as described below. The pitch of the foundation metal interconnection pads 103 between the dies may be a minimum pitch of the metal routing layer (e.g., M1 layer) or larger depending on the requirements of the desired scribe line.

Figure 3:
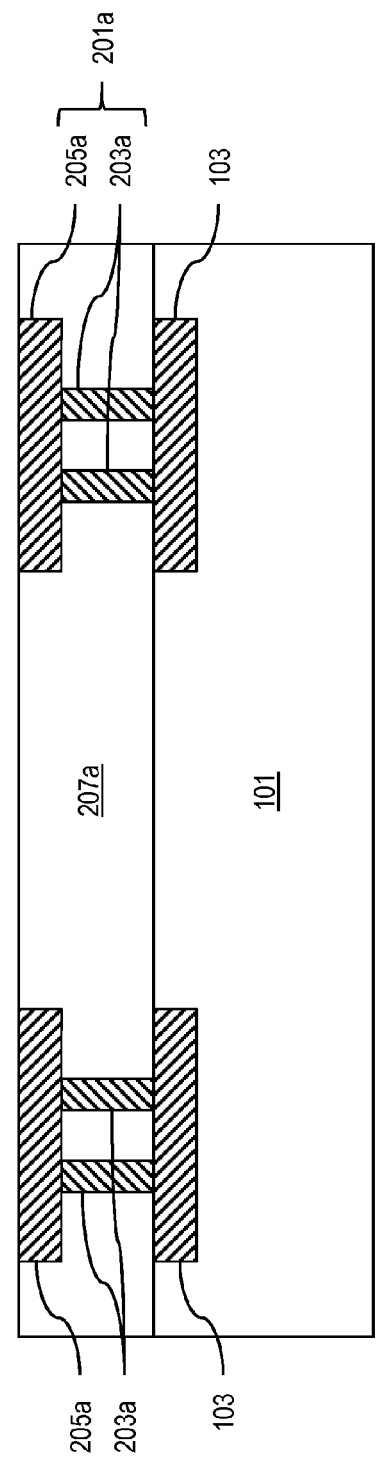

Adverting to FIG. 3, a metal interconnection layer 201a is formed above the substrate 101. The metal interconnection layer 201a includes a plurality of dummy VIAs 203a. If the substrate 101 includes the foundation metal interconnection pads 103, the dummy VIAs 203a are formed connecting to the foundation metal interconnection pads 103. The dummy VIAs 203a may be formed according to any conventional processing for forming VIAs. Although illustrated in groups of two over the foundation metal interconnection pads 103, there may be one or more dummy VIAs 203a formed over each foundation metal interconnection pad 103.

The metal interconnection layer 201a further includes a plurality of dummy metal lines 205a. The plurality of dummy metal lines 205a may be formed of a metal, such as Cu or Al. The plurality of dummy metal lines 205a may be formed when forming a routing layer within the dies of the semiconductor wafer, such as when forming the metal lines of the M1 metal routing layer in the dies. Thus, the plurality of dummy metal lines 205a can be formed of the same metal as the metal lines of the routing layer corresponding to the same level as the metal interconnection layer 201a within the semiconductor wafer.

The plurality of dummy metal lines 205a may be formed at the minimum pitch of the corresponding metal routing layer, or may be formed at a pitch larger than the minimum pitch. Further, the dummy metal lines 205a may be formed throughout substantially all of the area between the dies of the semiconductor wafer. For instance, the plurality of dummy metal lines 205a may be formed everywhere between the plurality of dies within the semiconductor wafer except for exclusion areas, which may include gaps surrounding the dies and scribe line monitoring regions, described in detail below.

The plurality of dummy VIAs 203a within the metal interconnection layer 201a vertically connect the plurality of dummy metal lines 205a to the substrate 101. Further, the plurality of dummy metal lines 205a laterally connect the plurality of dummy VIAs 203a within the metal interconnection layer 201a and each other (e.g., intersect). Thus, the metal interconnection layer 201a with the plurality of dummy VIAs 203a and the plurality of dummy metal lines 205a form one layer of a dummy metal structure that forms scribe lines between dies within the semiconductor wafer.

Although the plurality of dummy metal lines 205a appear to have the same dimensions as, and are in alignment with, the foundation metal interconnection pads 103, the plurality of dummy metal lines 205a may be offset from the foundation metal interconnection pads 103 and may have different dimensions than the foundation metal interconnection pads 103 as long as the plurality of dummy metal lines 205a laterally connect the plurality of dummy VIAs 203a.

The plurality of dummy VIAs 203a and the plurality of dummy metal lines 205a may be formed through and in a dielectric 207a. The dielectric 207a may be the same dielectric (i.e., an interlayer dielectric (ILD)) in which a corresponding layer of the dies within the semiconductor wafer, such as an M1 layer for the metal interconnection layer 201a, is formed.

Figure 4:
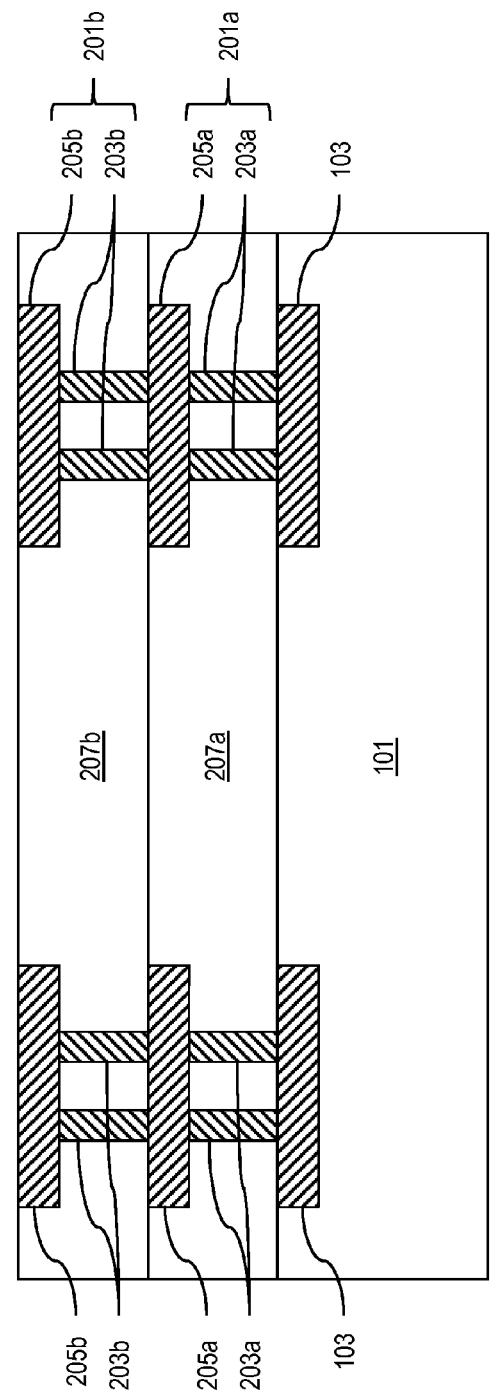

Adverting to FIG. 4, a metal interconnection layer 201b is formed above the metal interconnection layer 201a. The metal interconnection layer 201b includes a plurality of dummy VIAs 203b. The plurality of dummy VIAs 203b are connected to the plurality of dummy metal lines 205a of the metal interconnection layer 201a. The dummy VIAs 203b may be formed according to any conventional processing for forming VIAs. Although illustrated in groups of two over the plurality of dummy metal lines 205a, there may be one or more dummy VIAs 203b formed over each dummy metal line 205a. Further, the number of dummy VIAs 203b above each dummy metal line 205a may be the same as or different from the number of dummy VIAs 203a below each dummy metal line 205a.

The metal interconnection layer 201b further includes a plurality of dummy metal lines 205b. The plurality of dummy metal lines 205b may be formed of a metal, such as Cu or Al. As the dummy metal lines 205a, the plurality of dummy metal lines 205b can be formed of the same metal as a routing layer corresponding to the same level as the metal interconnection layer 201b within the semiconductor wafer, such as when forming the metal lines of the M2 metal routing layer in the dies.

The plurality of dummy metal lines 205b may be formed at a minimum pitch of the corresponding metal routing layer, or may be formed at a pitch larger than the minimum pitch. Further, the dummy metal lines 205b may be formed throughout substantially all of the area between the dies of the semiconductor wafer. For instance, the plurality of dummy metal lines 205b may be formed everywhere between the plurality of dies within the semiconductor wafer except for the exclusion areas.

The plurality of dummy VIAs 203b within the metal interconnection layer 201b vertically connect the plurality of dummy metal lines 205b to the metal interconnection layer 201a. Further, the plurality of dummy metal lines 205b laterally connect the plurality of dummy VIAs 203b within the metal interconnection layer 201b and each other (e.g., intersect). Thus, the metal interconnection layer 201b with the plurality of dummy VIAs 203b and the plurality of dummy metal lines 205b form one layer of the dummy metal structure that forms the scribe lines between dies within the semiconductor wafer.

The plurality of dummy VIAs 203b and the plurality of dummy metal lines 205b may be formed through and in a dielectric 207b. The dielectric 207b may be the same dielectric, i.e. an ILD, in which a corresponding layer of the dies within the semiconductor wafer, such as an M2 layer for the metal interconnection layer 201b, is formed.

Figure 5:
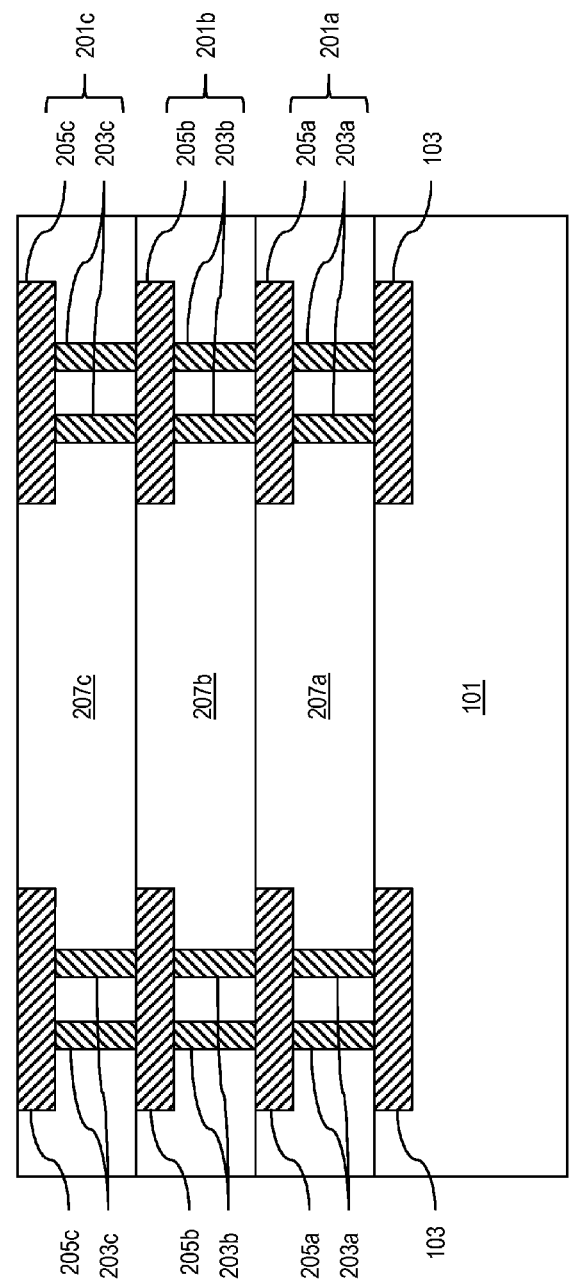

Adverting to FIG. 5, a metal interconnection layer 201c is formed above the metal interconnection layer 201b. The metal interconnection layer 201c includes a plurality of dummy VIAs 203c. The plurality of dummy VIAs 203c are connected to the plurality of dummy metal lines 205b of the metal interconnection layer 201b. The dummy VIAs 203c may be formed according to any conventional processing for forming VIAs. Although illustrated in groups of two over the plurality of dummy metal lines 205b, there may be one or more dummy VIAs 203c formed over each dummy metal line 205b. Further, the number of dummy VIAs 203c above each dummy metal line 205b may be the same as or different from the number of dummy VIAs 203b below each dummy metal line 205b.

The metal interconnection layer 201c further includes a plurality of dummy metal lines 205c. The plurality of dummy metal lines 205c may be formed of a metal, such as Cu or Al. As the dummy metal lines 205b, the plurality of dummy metal lines 205c can be formed of the same metal as a routing layer corresponding to the same level as the metal interconnection layer 201c within the semiconductor wafer, such as when forming the metal lines of the M2 metal routing layer in the dies.

The plurality of dummy metal lines 205c may be formed at a minimum pitch of the corresponding metal routing layer, or may be formed at a pitch larger than the minimum pitch. Further, the dummy metal lines 205c may be formed throughout substantially all of the area between the dies of the semiconductor wafer. For instance, the plurality of dummy metal lines 205c may be formed everywhere between the plurality of dies within the semiconductor wafer except for the exclusion areas.

The plurality of dummy VIAs 203c within the metal interconnection layer 201c vertically connect the plurality of dummy metal lines 205c to the metal interconnection layer 201b. Further, the plurality of dummy metal lines 205c laterally connect the plurality of dummy VIAs 203c within the metal interconnection layer 201c and each other (e.g., intersect). Thus, the metal interconnection layer 201c with the plurality of dummy VIAs 203c and the plurality of dummy metal lines 205c form one layer of the dummy metal structure that forms the scribe lines between dies within the semiconductor wafer.

The plurality of dummy VIAs 203c and the plurality of dummy metal lines 205c may be formed through and in a dielectric 207c. The dielectric 207c may be the same dielectric, i.e. an ILD, in which a corresponding layer of the dies within the semiconductor wafer, such as an M3 layer for the metal interconnection layer 201c, is formed.

The pattern formed by the plurality of dummy VIAs and the dummy metal lines for each metal interconnection layer 201a, 201b, and 201c may be the same or different as long as dummy VIAs within a metal interconnection layer vertically connect the metal interconnection layer to dummy metal lines of a lower metal interconnection layer, and as long as dummy metal lines of a metal interconnection layer laterally connect dummy VIAs within the metal interconnection layer. Further, although all of the dummy VIAs 203a, 203b, and 203c are illustrated as connecting to dummy metal lines and vice versa, not every dummy metal line and not every dummy VIA in each metal interconnection layer must be connected to a dummy VIA or a dummy metal line, respectively, without departing from the spirit and scope of the present disclosure. A percentage of dummy VIAs within a metal interconnection layer can vertically connect dummy metal lines within the metal interconnection layer to dummy VIAs of a lower metal interconnection layer. A percentage of dummy metal lines within a metal interconnection layer can laterally connect dummy VIAs within the metal interconnection layer. Such percentages may be increased or decreased depending on the characteristics of the semiconductor wafer, such as whether the semiconductor wafer includes ULK technology.

Figure 6:
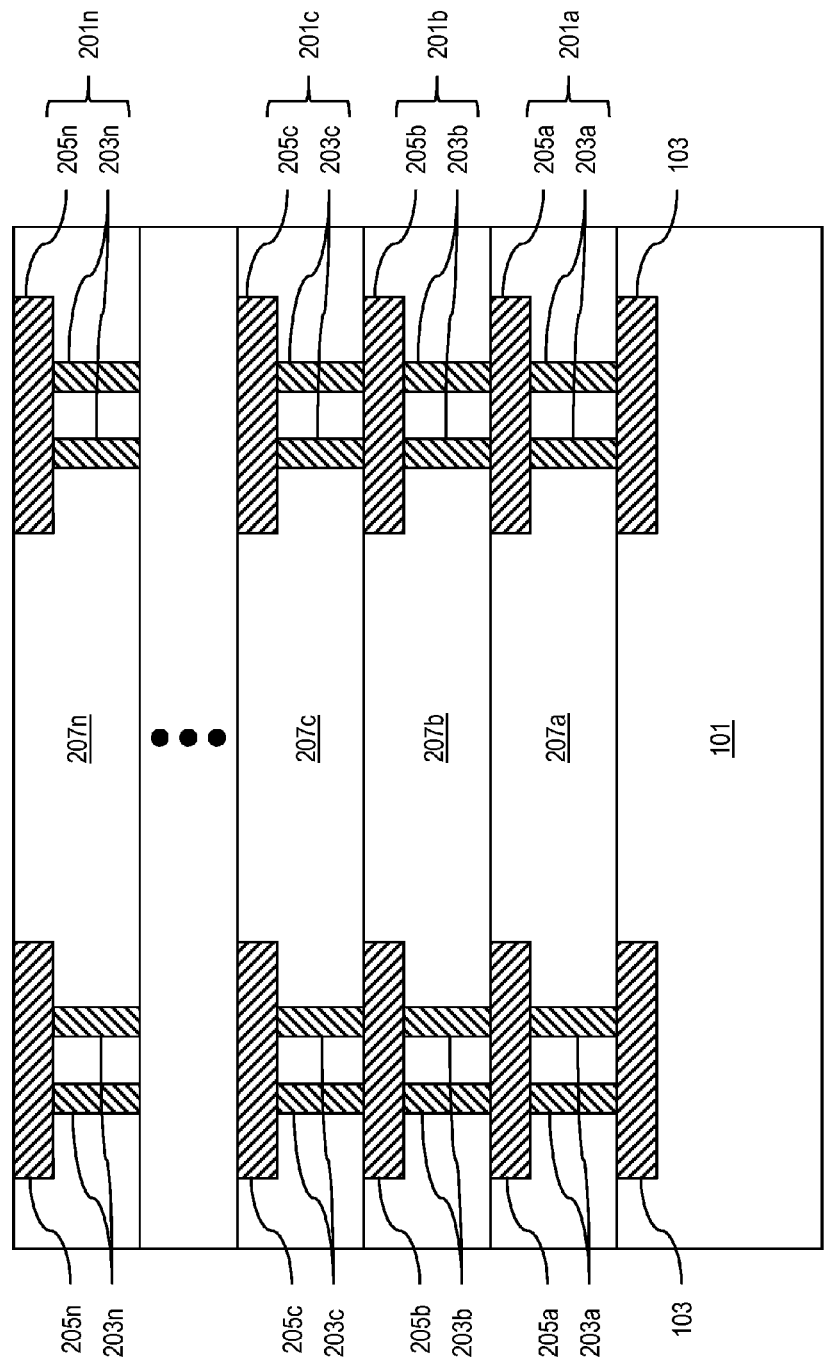

Adverting to FIG. 6, one or more metal interconnection layers can be formed according to the metal interconnection layers 201a, 201b, and 201c as required for forming the various layers of the dies of the semiconductor. That is, a metal interconnection layer according to 201a, 201b, or 201c can be formed corresponding to each layer of the plurality of dies (e.g., M1, M2, . . . Mn layers). However, although described as a metal interconnection layer 201a, 201b, or 201c, the additional metal interconnection layers may have different numbers of dummy VIAs, different pitches of dummy metal lines, different patterns formed by the dummy metal lines, etc., as long as dummy VIAs within each metal interconnection layer vertically connect dummy metal lines within the metal interconnection layer to dummy metals lines of a lower metal interconnection layer, and as long as dummy metal lines within each metal interconnection layer laterally connect dummy VIAs within the metal interconnection layers. Alternatively, dummy VIAs within a metal interconnection layer may pass through the metal interconnection layer immediately below the layer and instead connect to the plurality of metal dummy lines of a second, third, fourth, etc. metal interconnection layer below.

For instance, a metal interconnection layer 201n is formed as a final metal interconnection layer, as illustrated in FIG. 6. The dielectric 207n in which the metal interconnection layer 201n is formed may be the same dielectric, i.e. an ILD, used in forming a corresponding layer of the dies within the semiconductor wafer. The metal interconnection layer 201n includes a plurality of dummy VIAs 203n. The plurality of dummy VIAs 203n are vertically connected to a plurality of dummy metal lines of a lower metal interconnection layer (not shown for illustrative convenience). The dummy VIAs 203n may be formed according to any conventional processing for forming VIAs. Although illustrated in groups of two, there may be one or more dummy VIAs 203n grouped together. Further, the number of dummy VIAs 203n may be the same as or different from the number of dummy VIAs of lower metal interconnection layers 201a, 201b, and 201c.

The metal interconnection layer 201n further includes a plurality of dummy metal lines 205n. The plurality of dummy metal lines 205n may be formed of a metal, such as Cu or Al. As the dummy metal lines 205a, 205b, and 205c, the plurality of dummy metal lines 205n can be formed of the same metal as a routing layer corresponding to the same level as the metal interconnection layer 201n within the semiconductor wafer (e.g., Mn metal routing layer). The plurality of dummy metal lines 205n may be formed at a minimum pitch of the corresponding metal routing layer, or may be formed at a pitch larger than the minimum pitch. Further, the dummy metal lines 205n may be formed throughout substantially all of the area between the dies of the semiconductor wafer. For instance, the plurality of dummy metal lines 205n may be formed everywhere between the plurality of dies within the semiconductor wafer except for the exclusion areas.

The plurality of dummy VIAs 203n within the metal interconnection layer 201n vertically connect the plurality of dummy metal lines 205n to dummy metal lines of a lower metal interconnection layer. Further, the plurality of dummy metal lines 205n laterally connect the plurality of dummy VIAs 203n within the metal interconnection layer 201n and each other (e.g., intersect). Thus, the metal interconnection layer 201n with the plurality of dummy VIAs 203n and the plurality of dummy metal lines 205n form one layer of the dummy metal structure that forms the scribe line between dies within the semiconductor wafer.

Figure 7:
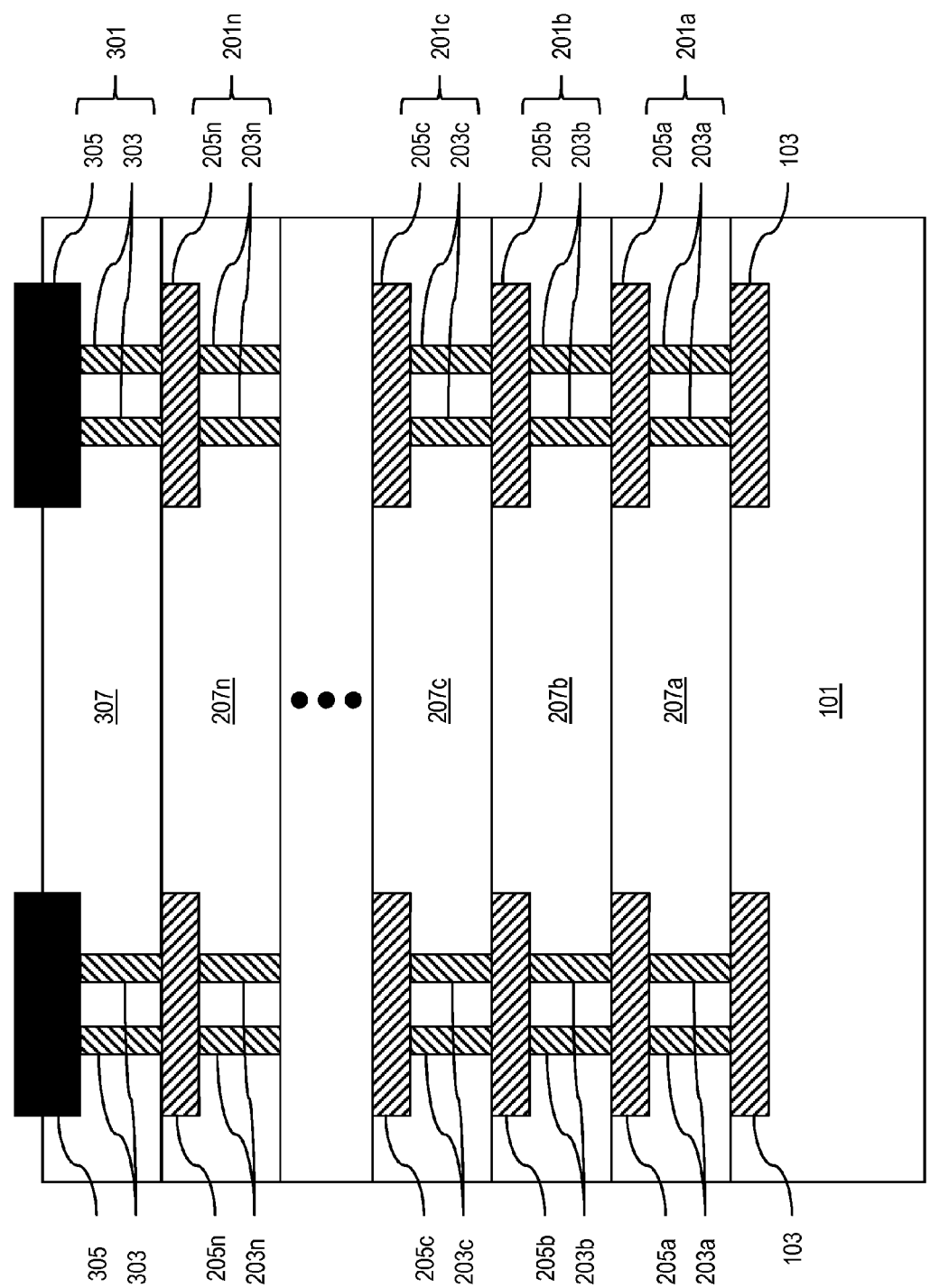

Adverting to FIG. 7, depending on the requirements of the dies of the semiconductor wafer, the top layer 301 may be a final, top metal interconnection layer or may be a metal layer. If a top metal interconnection layer, the top layer 301 may be formed in a dielectric 307, such as the same dielectric, i.e., an ILD, used in forming the corresponding layer in the dies within the semiconductor wafer. If a metal layer, the top layer 301 may be a metal layer, such as formed of Cu or Al. In either case, the top layer 301 may include a plurality of dummy VIAs 303. The plurality of dummy VIAs 303 are connected to the plurality of dummy metal lines 205n of the metal interconnection layer 201n. The dummy VIAs 303 may be formed according to any conventional processing for forming VIAs. Although illustrated in groups of two over the plurality of dummy metal lines 205n, there may be one or more dummy VIAs 303 formed over each dummy metal line 205n. Further, the number of dummy VIAs 303 above each dummy metal line 205n may be the same as or different from the number of dummy VIAs 203n below each dummy metal line 205n.

The top layer 301 further includes a plurality of dummy metal lines 305. The plurality of dummy metal lines 305 may be formed of a metal, such as Cu or Al. As the dummy metal lines 205n, the plurality of dummy metal lines 305 can be formed of the same metal as a routing layer corresponding to the same level as the top layer 301 within the semiconductor wafer. The plurality of dummy metal lines 305 may be formed at a minimum pitch of the corresponding metal routing layer within the dies, or may be formed at a pitch larger than the minimum pitch. Further, the plurality of dummy metal lines 305 may be formed throughout substantially all of the area between the dies of the semiconductor wafer. For instance, the plurality of dummy metal lines 305 may be formed everywhere between the plurality of dies within the semiconductor wafer except for the exclusion areas. Alternatively, the plurality of dummy metal lines 305 may be a plurality of dummy metal contacts formed according to the same process as forming a plurality of metal contacts for the dies of the semiconductor wafer.

The plurality of dummy VIAs 303 within the top layer 301 vertically connect the plurality of dummy metal lines 205n to the plurality of dummy metal lines 305. Further, the plurality of dummy metal lines 305 laterally connect the plurality of dummy VIAs 303 within the top layer 301 and each other (e.g., intersect). Thus, the top layer 301 with the plurality of dummy VIAs 303 and the plurality of dummy metal lines 305 form one layer of a dummy metal structure that forms scribe lines between dies within the semiconductor wafer.

Figure 8:
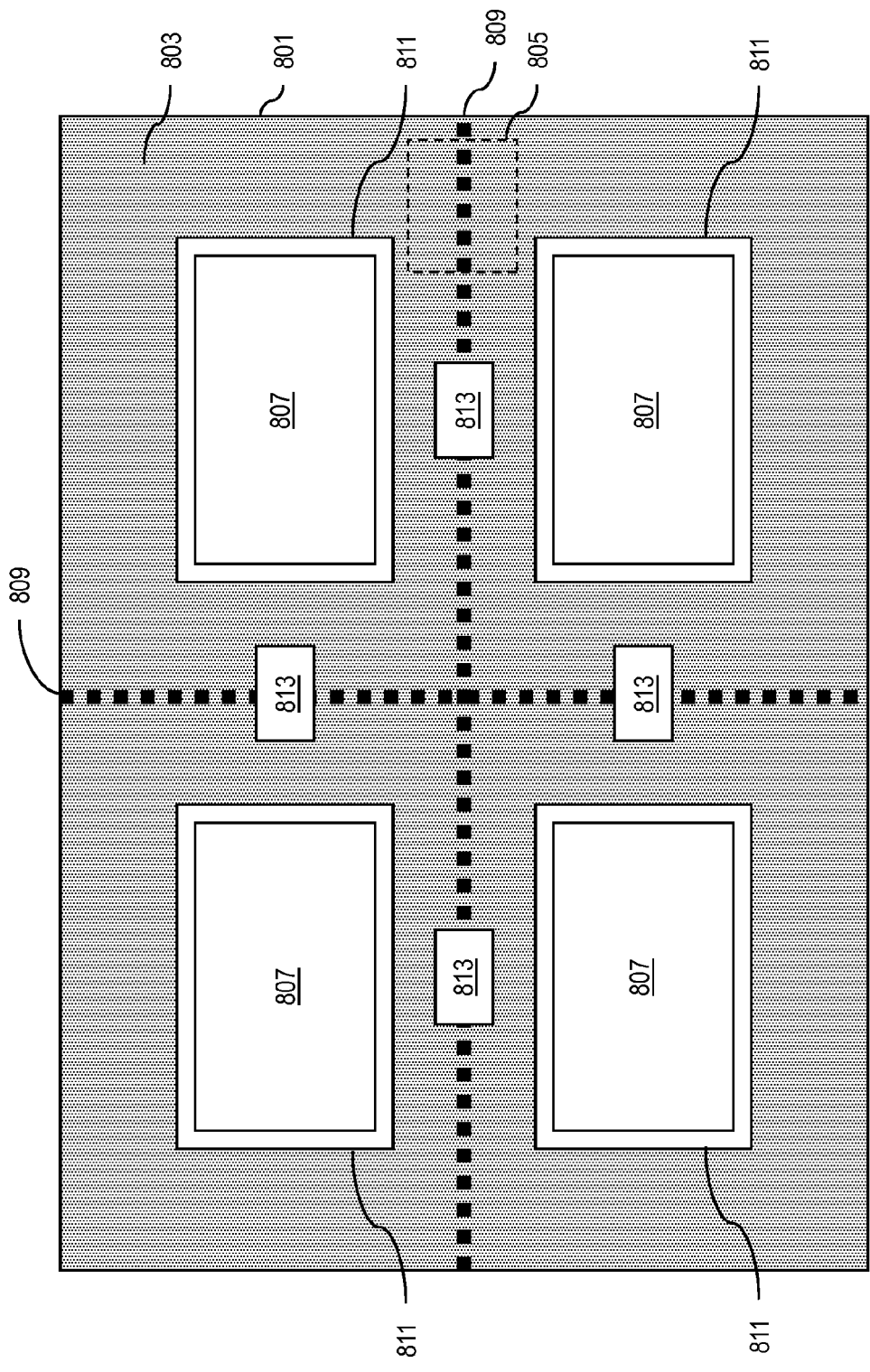
FIG. 8 illustrates a plan view of a semiconductor wafer, in accordance with an exemplary embodiment.

Adverting to FIG. 8, FIG. 8 illustrates a plan view of a semiconductor wafer 801, in accordance with an exemplary embodiment. The semiconductor wafer 801 includes a dummy metal structure 803 formed according to the process described above with respect to FIGS. 1 through 7. A portion 805 of the dummy metal structure 803 is illustrated and described in detail below with respect to FIGS. 9A through 9D.

The semiconductor wafer 801 further includes dies 807. Although only four dies 807 are illustrated, one of ordinary skill in the art would understand that the semiconductor wafer 801 may include various numbers of dies 807. According to the foregoing, the dummy metal structure 803 between the dies 807 forms horizontal and vertical scribe lines 809 to separate the dies 805.

Between the dies 807 and the dummy metal structure 803 are gaps 811, and within the dummy metal structure 803 are scribe line monitoring regions 813. The gaps 811 and the scribe line monitoring regions 813 are examples of the exclusion areas discussed above.

The gaps 811 may be formed during the process described with respect to FIGS. 1 through 7 by forming dielectric between the dies 807 and the plurality of dummy VIAs and/or plurality of dummy metal lines of the dummy metal structure 803.

The scribe line monitoring regions 813 may be used for locating and following the scribe lines 809 in separating the dies 807 within the semiconductor wafer 801. As described above, the dummy metal structure 803 formed by the process discussed with respect to FIGS. 1 through 7 may cover substantially all of the area of the semiconductor wafer 801, except for the areas of the dies 807, the gaps 811, and the scribe line monitoring regions 813.

Figure 9A:
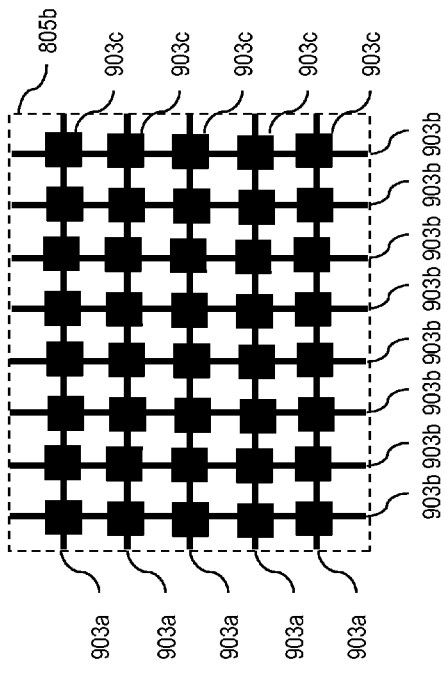
FIGS. 9A through 9D illustrate patterns of dummy metal structures, in accordance with exemplary embodiments.

FIGS. 9A through 9D illustrate metal interconnection portions 805a through 805d of the dummy metal structure 803, in accordance with exemplary embodiments. FIG. 9A illustrates one metal interconnection layer portion 805a of the dummy metal structure 803 of FIG. 8. The metal interconnection layer portion 805a includes horizontal dummy metal lines 901a and vertical dummy metal lines 901b. The horizontal dummy metal lines 901a may be orthogonal to the vertical dummy metal lines 901b. Further, where they intersect, the horizontal dummy metal lines 901a may connect to the vertical dummy metal lines 901b.

Figure 9B:
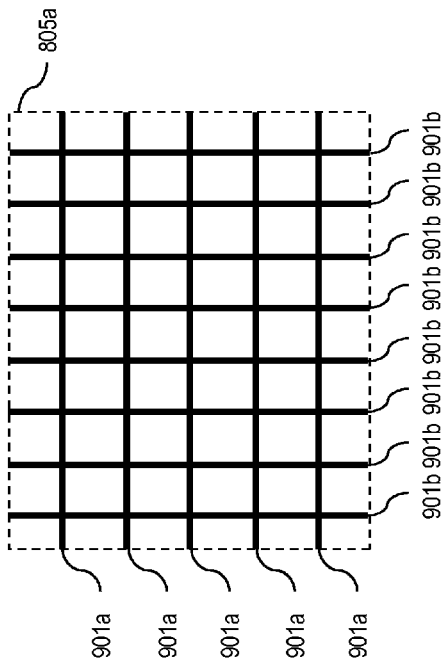

FIG. 9B illustrates a similar metal interconnection layer portion 805b of the dummy metal structure 803 with horizontal dummy metal lines 903a and vertical dummy metal lines 903b. The horizontal dummy metal lines 903a also may be orthogonal to the vertical dummy metal lines 903b. Further, where they intersect, the horizontal dummy metal lines 903a may connect to the vertical dummy metal lines 903b at junction areas 903c. The junction areas 903c may have widths and lengths that are larger than the widths of the horizontal dummy metal lines 903a and the vertical dummy metal lines 903b.

Figure 9C:
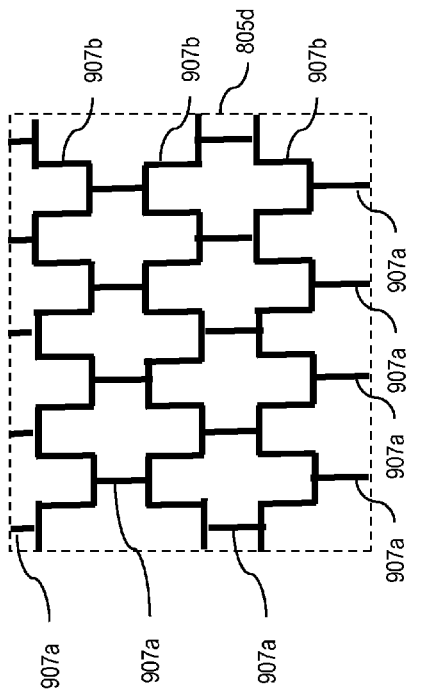

FIG. 9C illustrates a metal interconnection layer portion 805c with downward-angled dummy metal lines 905a and upward-angled dummy metal lines 905b. According to metal interconnection layer 805c, the downward-angled dummy metal lines 905a and the upward-angled dummy metal lines 905b may intersect at angles other than ninety degrees, such as 60 and 120 degrees. However, the angles of intersections may vary without departing from the spirit and scope of the present disclosure.

Figure 9D:
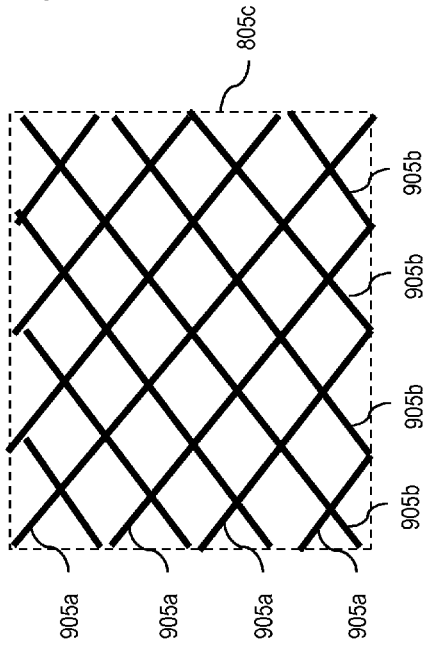

FIG. 9D illustrates that the dummy metal lines of metal interconnection layers may be shapes other than straight lines according to metal interconnection layer portion 805d. The metal interconnection layer portion 805d may include dummy metal line segments 907a connecting meandering dummy metal lines 907b.

Based on the exemplary metal interconnection layer portions 805a through 805d, the dummy metal structure 803 may be formed of metal interconnection layers with different patterns as long as dummy metal lines within a layer laterally connect dummy VIAs in the layer, and dummy VIAs within a layer connect dummy metal lines within the layer to dummy metal lines of a lower layer. Further, the lower layer may be a metal interconnection layer several layers below the metal interconnection layer at issue. That is, dummy VIAs within a metal interconnection layer may pass through the metal interconnection layer immediately below the layer and instead connect to the plurality of metal dummy lines of the second, third, fourth, etc. metal interconnection layer below.

Figure 10:
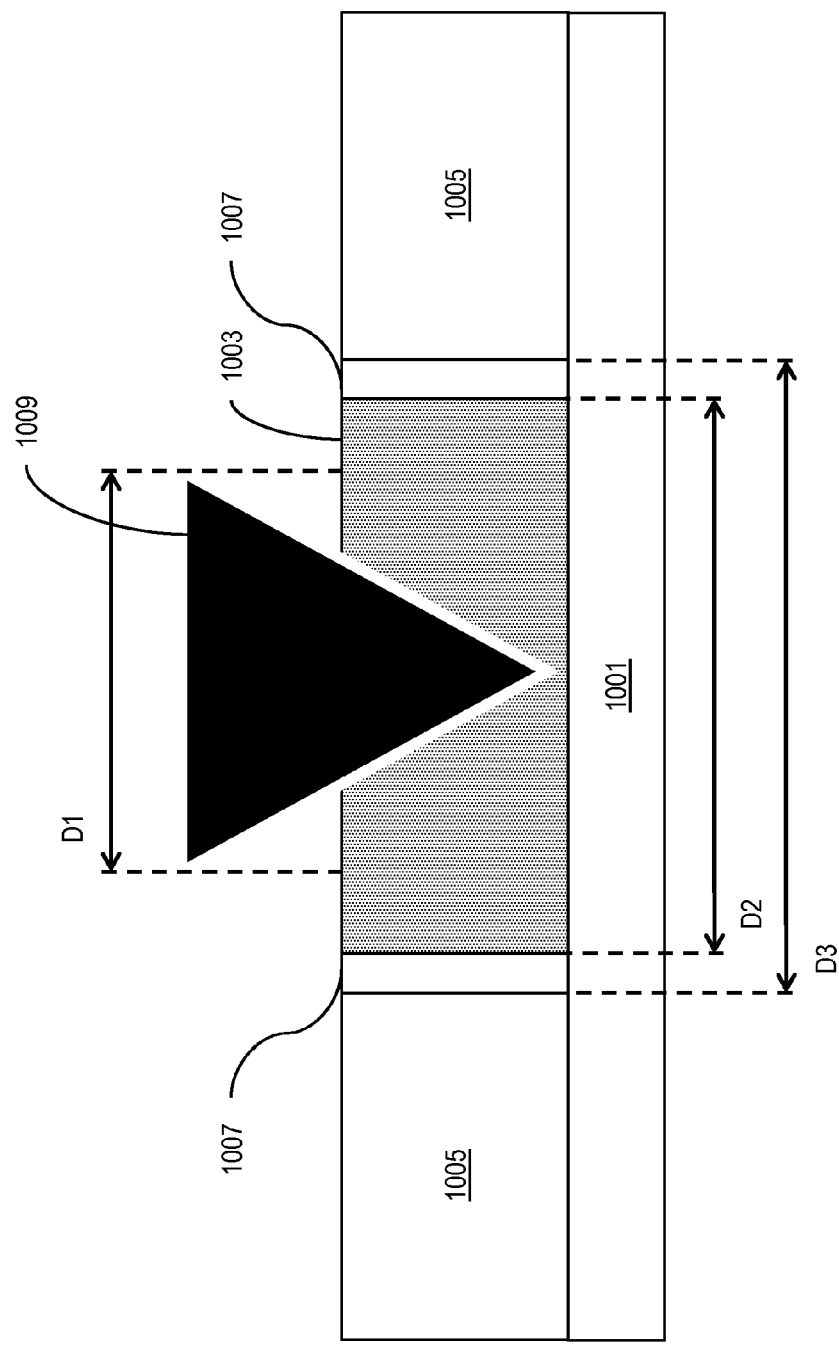
FIG. 10 illustrates dimensions of a scribe line of a dummy metal structure, in accordance with an exemplary embodiment.

FIG. 10 illustrates the dimensions of a dummy metal structure and surrounding features, in accordance with an exemplary embodiment. FIG. 10 illustrates a substrate 1001, such as the substrate 101 discussed above. Above the substrate 1001 includes a scribe line 1003 of a dummy metal structure, such as the scribe line 809 of the dummy metal structure 803, between two dies 1005, such as the dies 807. Between the dies 1005 and the scribe line 1003 of the dummy metal structure are gaps 1007, such as gaps 811 discussed above. Also illustrated is a saw 1009 used to cut the portion 1003, as illustrated, to separate the dies 1005.

Alternative to the saw 1009, a laser may be used to separate the dies 1005. The saw 1009 may be a distance D1 in width. The distance D1 may be 60 to 100 micrometers (μm), such as 80 μm.

The width of the scribe line 1003 may be a distance D2. The distance D2 may be large enough to leave space between the edges of the saw 1009 and the edges of the scribe line 1003. The distance D2 may be 80 to 120 μm, such as 100 μm.

The width of the scribe line 1003, including the gaps 1007, is a distance D3. The additional space of the gaps 1007 further prevents delamination and cracking within the layered structure of the dies 1005 during separation of the dies. The distance D3 can be 82 to 122 μm, such as 102 μm, allowing for a width of 1 μm for the gaps 1007. One of ordinary skill in the art will understand, however, that the distances D1 through D3 may vary depending on the size of the technology used in forming the dies 1005.

The embodiments of the present disclosure achieve several technical effects, including improved delamination and crack resistance in a semiconductor wafer during die separation. The embodiments of the present disclosure facilitate stress dissipation during separation of the dies in part based on a higher metal density. According the specific spacing requirements of the present disclosure, damage such as cracking within dies of the semiconductor wafers may also be prevented. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras, particularly for semiconductor processing using ULK technology.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first metal interconnection layer above a substrate of a semiconductor wafer and between a plurality of die regions, the first metal interconnection layer including a first plurality of dummy vertical interconnect accesses (VIAs) and a first plurality of dummy metal lines,
   wherein the first plurality of dummy metal lines laterally connect the first plurality of dummy VIAs;
   forming a second metal interconnection layer above the first metal interconnection layer and between the plurality of die regions, the second metal interconnection layer including a second plurality of dummy VIAs and a second plurality of dummy metal lines,
   wherein the second plurality of dummy VIAs vertically connect the first plurality of dummy metal lines with the second plurality of dummy metal lines, and the second plurality of dummy metal lines laterally connect the second plurality of dummy VIAs; and
   forming one or more of the first metal interconnection layer and the second metal interconnection layer, in alternating order, in forming remaining metal interconnection layers of the semiconductor wafer,
   wherein each of the first plurality of dummy metal lines and the second plurality of dummy metal lines includes a first set of the dummy metal lines that extend in a first direction and a second set of the dummy metal lines that extend in a second direction.

2. The method according to claim 1, comprising:
   forming the first plurality of dummy metal lines across substantially all of an area between the plurality of die regions; and
   forming the second plurality of dummy metal lines across substantially all of the area between the plurality of die regions.

3. The method according to claim 1, wherein the second direction is orthogonal to the first direction.

4. The method according to claim 1, wherein the first set and the second set within each of the first plurality of dummy metal lines and the second plurality of dummy metal lines connect at intersections to form junction areas.

5. The method according to claim 4, wherein widths and lengths of the junction areas are larger than widths of the first plurality of dummy metal lines and the second plurality of dummy metal lines.

6. The method according to claim 1, further comprising:
   forming foundation metal interconnection pads within the substrate and/or on a top surface of the substrate; and
   forming the first plurality of dummy VIAs connected to the foundation metal interconnection pads.

7. The method according to claim 1, comprising:
   forming the first metal interconnection layer and the second metal interconnection layer separated from the plurality of die regions by a gap.

8. The method according to claim 1, wherein a pattern formed by the first plurality of dummy metal lines is different from a pattern formed by the second plurality of dummy metal lines.

9. A method comprising:
   forming metal interconnection layers extending from a substrate of a semiconductor wafer to a top metal interconnection layer of the semiconductor wafer between a plurality of die regions, each of the metal interconnection layers including a plurality of dummy vertical interconnect accesses (VIAs) and a plurality of dummy metal lines,
   wherein the plurality of dummy metal lines laterally connect the plurality of dummy VIAs within each respective metal interconnection layer, and a plurality of dummy VIAs within a first metal interconnection layer vertically connect a plurality of dummy metal lines within the first metal interconnection layer to a plurality of dummy metal lines within a second metal interconnection layer, wherein the second metal interconnection layer is below the first metal interconnection layer;
   forming foundation metal interconnection pads within the substrate; and
   forming the plurality of dummy VIAs of a metal interconnection layer immediately above the substrate connected to the foundation metal interconnection pads,
   wherein the plurality of dummy metal lines of each metal interconnection layer extend across substantially all of an area between the plurality of die regions, and the plurality of dummy metal lines of each metal interconnection layer include a first set of the dummy metal lines that extend in a first direction and a second set of the dummy metal lines that extend in a second direction.

* * * * *